United States Patent

Oku et al.

Patent Number: 5,253,010
Date of Patent: Oct. 12, 1993

[54] PRINTED CIRCUIT BOARD

[75] Inventors: Shunji Oku; Kiyoshi Seigenji; Masao Naito; Yoshiyuki Mizumo, all of Osaka, Japan

[73] Assignee: Minolta Camera Kabushiki Kaisha, Japan

[21] Appl. No.: 895,260

[22] Filed: Jun. 8, 1992

Related U.S. Application Data

[63] Continuation of Ser. No. 622,162, Nov. 30, 1990, abandoned, which is a continuation of Ser. No. 350,771, May 11, 1989, abandoned.

[30] Foreign Application Priority Data

May 13, 1988 [JP] Japan ................... 63-117556
May 14, 1988 [JP] Japan ................... 63-117863
May 16, 1988 [JP] Japan ................... 63-64570

[51] Int. Cl.$^5$ .................... G03B 7/00; H05K 1/00; H01L 23/02
[52] U.S. Cl. .................... 354/485; 174/52.4; 361/749; 361/783; 361/40
[58] Field of Search ............. 354/485, 471; 361/398, 361/400, 414; 174/52.5, 52.4

[56] References Cited

U.S. PATENT DOCUMENTS

| | | | |
|---|---|---|---|
| 4,134,654 | 1/1979 | Murakami et al. | 354/485 |
| 4,215,387 | 7/1980 | Negishi et al. | 361/398 |
| 4,763,407 | 8/1988 | Abe | 174/52.4 |

FOREIGN PATENT DOCUMENTS

| | | |
|---|---|---|
| 188684 | 10/1983 | Japan . |
| 87415 | 4/1986 | Japan . |
| 330 | 7/1988 | Japan . |
| 65242 | 8/1988 | Japan . |
| 65253 | 9/1988 | Japan . |
| 65243 | 10/1988 | Japan . |

Primary Examiner—Russell E. Adams
Assistant Examiner—Cassandra C. Spyrou
Attorney, Agent, or Firm—Price, Gess & Ubell

[57] ABSTRACT

A flexible printed circuit board for use in a display unit of a camera, which includes a flexible substrate with a printed circuit pattern, a die of an integrated circuit chip mounted on said substrate for driving the display drive, a plurality of wires, and resin sealant for covering said integrated circuit chip. The flexible substrate has first terminals to be in contact with a display device and second terminals in electric connections to said first terminals, respectively. The die of the integrated circuit chip includes a plurality of connecting terminals. The plurality of wires are for bonding said connecting terminals of the integrated circuit chip to said second terminals of said printed circuit pattern.

15 Claims, 8 Drawing Sheets

PRINTED CIRCUIT BOARD

This is a continuation of application Ser. No. 622,162, filed on Nov. 30, 1990 now ABN which is a continuation of application Ser. No. 350,771, filed on May. 11, 1989, now abandoned, for a PRINTED CIRCUIT BOARD.

BACKGROUND OF THE INVENTION

1. Field of the Invention

The present invention relates to a printed circuit board, and more particularly to a flexible printed circuit board for use in a compact apparatus such as a camera.

2. Description of the Related Art

In this field of art, the display integrated circuit 3 (hereinafter, referred to as display IC), and the display device 6 or 7 for the display unit of the camera have been conventionally mounted on the same printed circuit board 2, on which a control IC 4 and a photometric IC 5 are also mounted, as shown in FIG. 1. However, with the use of a liquid crystal device LCD in both the display 6 on the camera body and the display 7 in the finder in addition to the increase in display informations required in recent years, the display circuit pattern and other circuit patterns have become intricate on the flexible printed circuit board, with the display circuit patterns getting in the way of other circuit patterns or even limiting the ability to lay out a display circuit on the printed circuit board. As shown in FIG. 1 for example, the circuit pattern connecting display IC 3 to on-body display element 6 and in-finder display element 7 would intersect the circuit pattern connecting control IC 4 to terminal pattern 2B for the release SW and terminal patterns 2C for various setting switches. Designing display functions freely has become impossible due to the above mentioned difficulty in laying out circuit patterns.

On the other hand display integrated circuit 3 has been conventionally of a flat package type F as shown in FIG. 2, and is mounted on the flexible printed circuit board 2 by means of solder H. This has caused a bulkiness of the display unit of the camera.

Further, in this field of art, there are various demands to improve the structure of the printed circuit board itself in view of its compactness, solidity and reliability.

SUMMARY OF THE INVENTION

An object of the present invention is to provide a flexible printed circuit board constituting a compact display unit for use in cameras.

Another object of the present invention is to provide a printed circuit board with a die of an integrated circuit chip family mounted thereon.

Still another object of the present invention is to provide a flexible printed circuit board with a die of integrated circuit chip mounted thereon with a compactness and high reliability.

To attain the above mentioned objects and other objects, the present invention provides a flexible printed circuit board for use in a display unit of a camera, comprising a flexible substrate with printed circuit pattern; a die of integrated circuit chip for a display drive mounted on said substrate; a plurality of wires for bonding the integrated circuit chip to respective portions of said printed circuit pattern; resin sealant for covering said integrated circuit chip; and a display device in contact with corresponding portions of said printed circuit pattern for electric connection to said integrated circuit through said printed circuit pattern. According to this feature of the present invention, an extremely compact display unit for a camera is obtainable.

According to another feature of the present invention, a structure of mounting a die of integrated circuit on a substrate is improved. Namely the present invention provides a printed circuit board comprising a substrate with a printed circuit pattern; a die of integrated circuit chip mounted on said substrate; a plurality of wires for bonding the integrated circuit chip to respective portions of said printed circuit pattern; a frame for encircling said integrated circuit chip; water repellent adhesive for gluing said frame to said substrate; resin sealant filling inside said frame for covering said integrated circuit chip; and a second type of adhesive sticking to the outside wall of said frame and said substrate. This structure is for strengthening the adhesion of said frame to said substrate as well as providing a satisfactory waterproof seal between the frame and the substrate.

Still another feature of the present invention provides a flexible printed circuit board comprising a flexible substrate with a printed circuit pattern having an array of terminals; a cover film on said circuit pattern for isolating said circuit pattern from unnecessary electric contact with the outside, said cover film being partially removed at the terminals along the array thereof; a die of integrated circuit chip mounted on said substrate; and a plurality of wires for bonding the integrated circuit chip to the terminals of said printed circuit pattern, wherein the manner of removal of said cover film at said terminals fulfills the following conditions:

$$X < 2 \text{ mm}$$

$$L > 0.4 \text{ mm}$$

wherein X represents the width of the array of the terminals of said circuit pattern with said cover film removed; and L represents the length of each of said terminals of the circuit pattern uncovered by said cover film. This feature is for realizing a compact and reliable combination of a flexible printed circuit substrate and a die of an integrated circuit mounted thereon.

The features of the present invention which are believed to be novel are set forth with particularity in the appended claims. The present invention, both as to its organization and manner of operation, together with further objects and advantages thereof, may best be understood by reference to the following description, taken in conjunction with the accompanying drawings.

DETAILED DESCRIPTION OF THE PREFERRED EMBODIMENTS

The following specification, taken in conjunction with the drawings, sets forth the present invention in such a manner to enable any person skilled in the art to utilize the invention. The embodiments of the invention disclosed herein are the best modes contemplated by the inventors of carrying out their invention in a commercial environment, although it should be understood that various modifications can be accomplished within the parameters of the invention.

Figure 3:
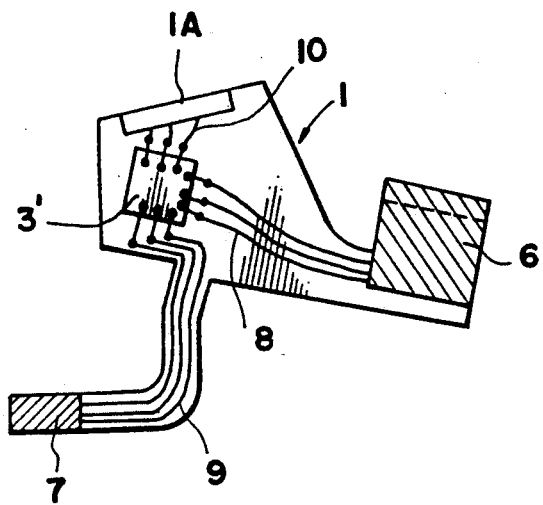
FIG. 3 represents a plane view of a preferred embodiment according to the present invention.
Figure 4:
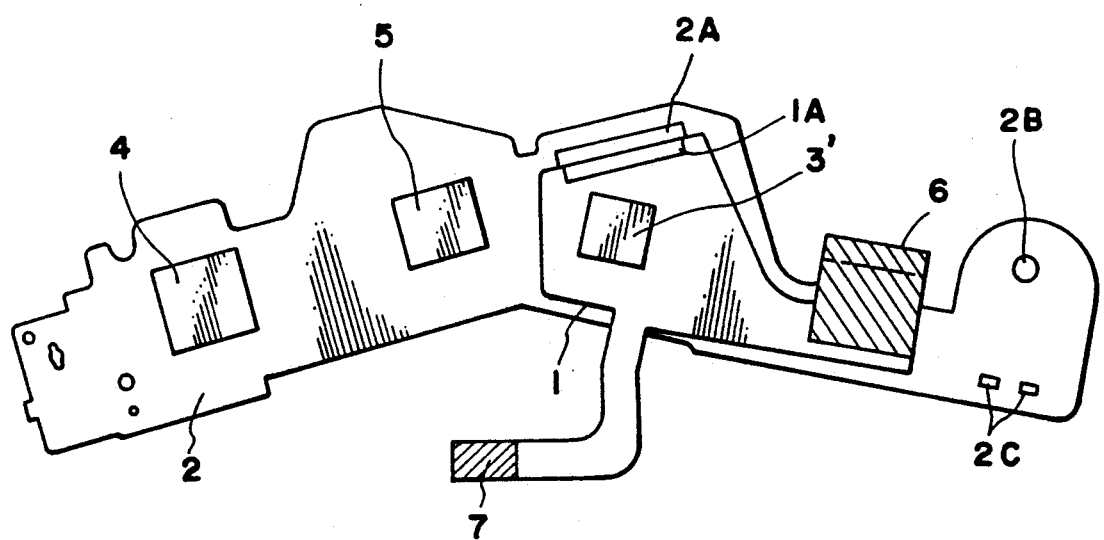
FIG. 4 represents a plane view of a preferred embodiment according to the present invention combined with an additional portion thereof.

An embodiment of the present invention is shown in FIGS. 3 to 7. In FIG. 3 and FIG. 4, numeral 1 is the flexible printed circuit board for a display unit on which display IC 3', on-body display device 6 and in-finder display device 7 are mounted. Also is provided on substrate 1 a printed circuit pattern 8 and 9 for connection of display IC 3' to on-body display device 6 and to in-finder display device 7. The printed circuit pattern includes portion 10 leading to connection terminal pattern 1A formed on the edge to which another printed circuit is to be connected.

Figure 5:
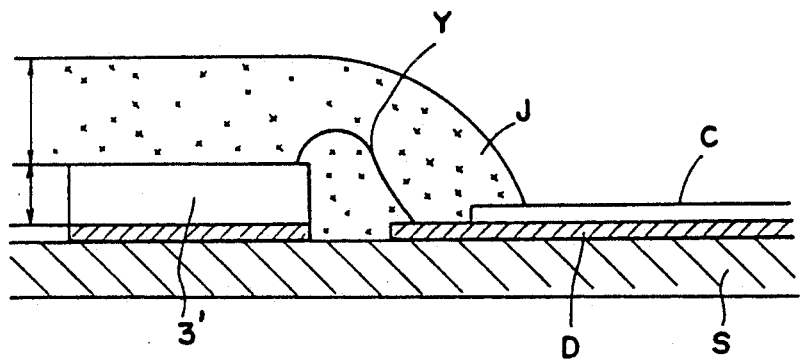
FIG. 5 represents a cross sectional view of a portion of the preferred embodiment.
Figure 1:
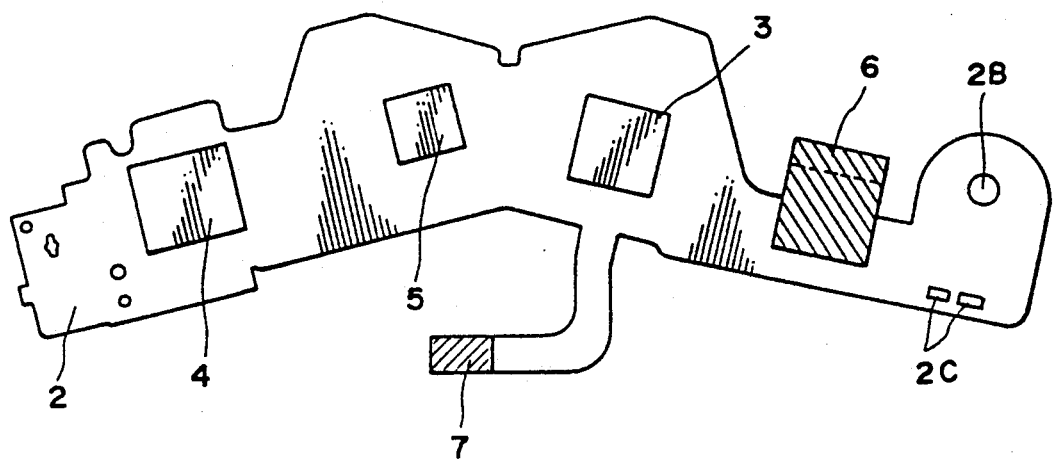
FIG. 1 represents a plane view of a related art.

As shown in FIG. 5, display IC 3' is of a die of integrated circuit chip mounted directly on the printed circuit board 1 having a flexible substrate S, wire-bonded to corresponding portions of circuit pattern D of the board with a plurality of metal wires Y (only one of which is shown) and is coated with sealing resin J. C represents a cover film for isolating the circuit pattern D from unnecessary electric contact with the outside, a portion of cover film C being removed to allow wire Y to connect to pattern D.

Figure 6:
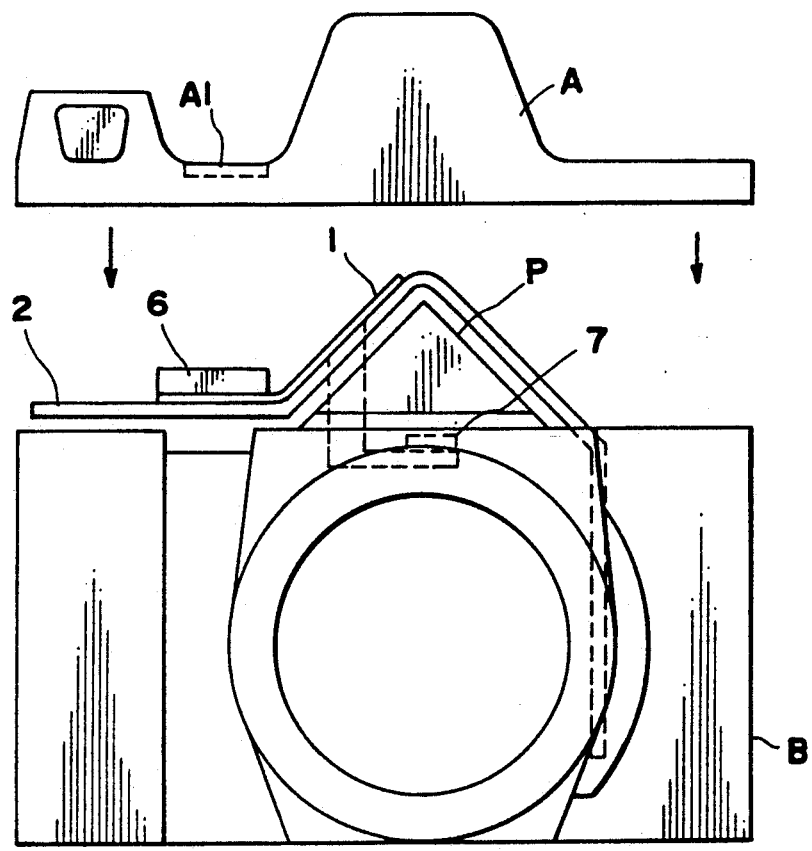
FIG. 6 represents a front view of a camera with its upper cover separated, in which the embodiment of the present invention as in FIG. 4 is incorporated therein.

Referring to FIG. 4, the main camera control circuit such as control IC 4 and photometric IC 5 are located on flexible main printed circuit board 2 other than the display printed circuit board. Connecting terminal patterns 2B and 2C for connecting to release switch and various setting switches located on upper cover A in FIG. 6 are also formed on main printed circuit board 2. Display printed circuit board 1 is stacked on main printed circuit board 2 as shown in FIG. 4 and the connecting terminal pattern 1A of display printed circuit board 1 is soldered with a connecting terminal pattern 2A of the main printed circuit board 2.

Figure 7:
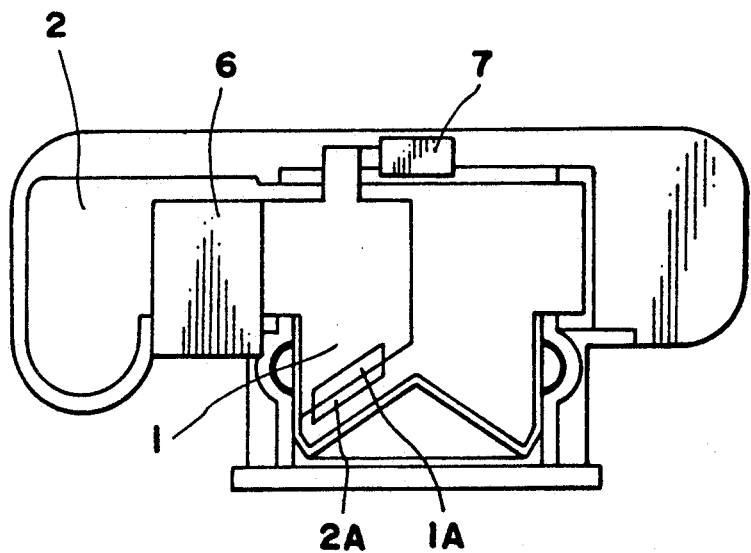
FIG. 7 represents a plane view of the camera of FIG. 6 with its upper cover removed, in which the embodiment of the present invention as in FIG. 4 is incorporated therein.

The flexible printed circuit boards, connected and soldered in this manner, are positioned along body B as shown in FIG. 6 or 7 so that display element 6 on the body is under display window A1 and finder display element 7 is positioned under pentagonal prism P.

As in the above embodiment, the various elements are divided into two groups, one being for mounting on the display printed circuit board and the other on the main printed circuit board. In other words, display IC chip is mounted directly on the display printed circuit board, and display devices on the body and in the finder are also mounted on the display printed circuit board, with a circuit pattern provided thereon for connecting the above two display devices to the display IC. A connecting terminal pattern for connecting the display IC to control IC mounted on the main printed circuit board is formed on the edge of the display printed circuit board. The above two printed circuit boards are connected with the connecting terminal patterns and installed in the camera.

In operation of display of camera information, the control IC outputs photographing information signals, and the display IC drives the display device in accordance with the photographing information signals, to have the display device inform a person of the photographing information. In designing printed circuit boards, it is useful to investigate into electric connections among the above elements. In other words, the control IC itself is required to have a great number of electric connections with various peripheral circuits, while the display IC is only required to have a connection with the control IC. This means that the number of connecting terminals between the main printed circuit board 2 and display printed circuit board 1 is relatively small. Thus, the structure with the display IC and display devices separated from the main printed circuit board, mounted with the control IC, will simplify the circuit patterns on the main printed circuit board 2 with the connection to the display printed circuit board 1 also kept simple.

Figure 2:
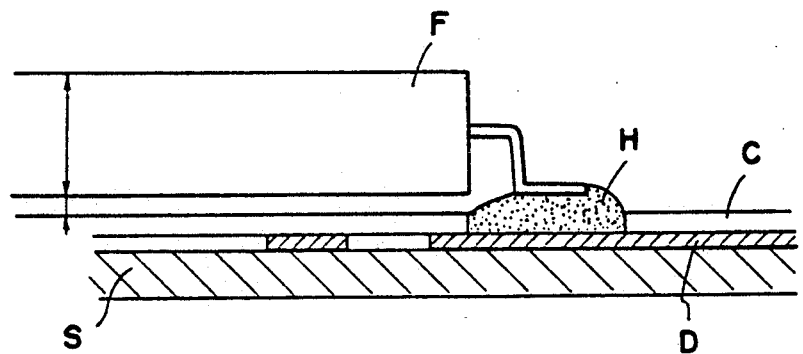
FIG. 2 represents a cross sectional view of a portion of a related art.

However, since the display printed circuit board 1 must be stacked over printed circuit board 2, the problem of an increase in the size of the camera will arise as the dimension in the thickness direction will increase by stacking the boards. In the present invention, accordingly, a die of display IC chip 3' is mounted directly on printed circuit board 1 by wire bonding as shown in FIG. 5 instead of adopting a conventional flat packaged display IC as shown in FIG. 2 to avoid increasing the height of the board.

Now the description is to be directed to a detailed structure for mounting a die of an integrated circuit chip on a printed circuit board, especially on a flexible printed circuit board. Such a structure is applicable to the combination of display IC and flexible printed circuit board in FIG. 3.

Figure 8:
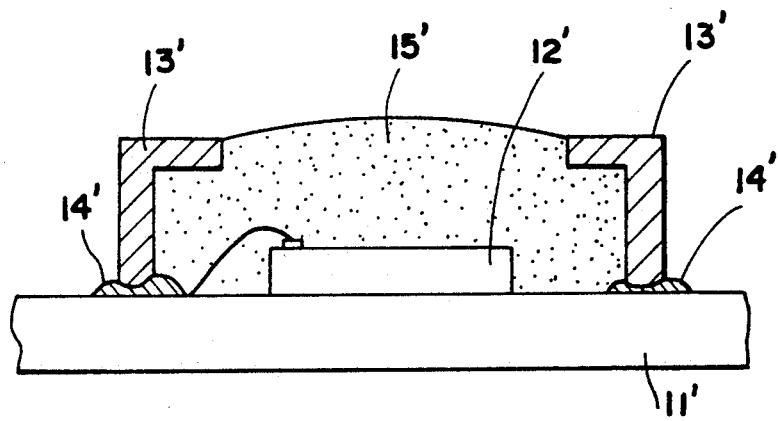
FIG. 8 represents a cross sectional view of another related art.

As shown in FIG. 8, when an IC chip is mounted on a circuit board, a conventional process is such that frame 13' which extends around the entire periphery of a chip 12' is adhered to the circuit board 11' with water repellent adhesive 14' for the purpose of providing waterproof between the frame and the circuit board. The inside of the frame 13' is filled with a resin sealant 15' (for example, epoxy resin). Such a frame is adopted for the purpose of preventing the resin sealant 15' from flowing far from the IC chip before it is hardened.

With the process shown in FIG. 8, silicon adhesives are mainly used as the water repellent adhesive for adhering the frame 13' to the circuit board 11' but, in most cases, the adhesive force is insufficient. Consequently, there is danger that the application of a strong external force to the frame 13' will detach the frame 13' from the circuit board 11'. In the case where the circuit board 11' is a flexible circuit board, especially, the water repellent adhesive 14' will peel when the circuit board 11' is bent.

Figure 9:
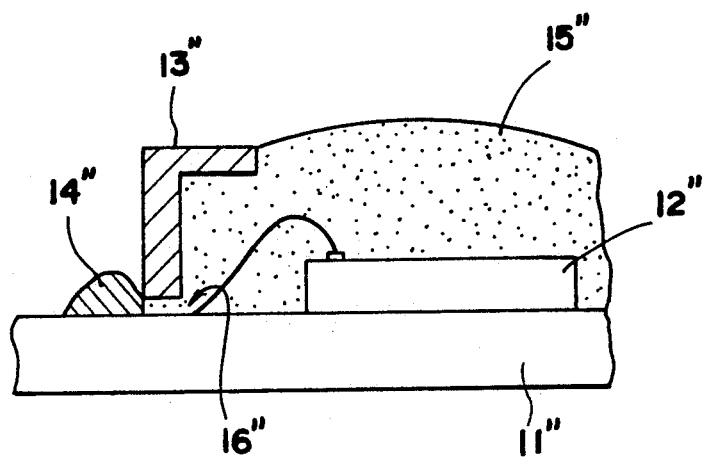
FIG. 9 represents a cross sectional view of still another related art.

As shown in FIG. 9, another process has also been proposed in which the frame 13" is temporarily adhered with a water repellent adhesive 14" with a gap 16' formed between the frame 13" and the circuit board 11". And then, adhesive resin sealant 15" is filled in such a way that it also enters the gap 16' between the circuit board 11" and frame 13" to glue the frame 13" to the circuit board 11" with the resin sealant 15". However, in this case, a specific resin sealant 15" which has sufficient adhesive force is required. This extremely limits the selection of resin sealant 15" which can be used.

Under the above background, another feature of the present invention provides a detailed structure of gluing the frame on the circuit board with a sufficient adhesive force and waterproof.

Figure 10:
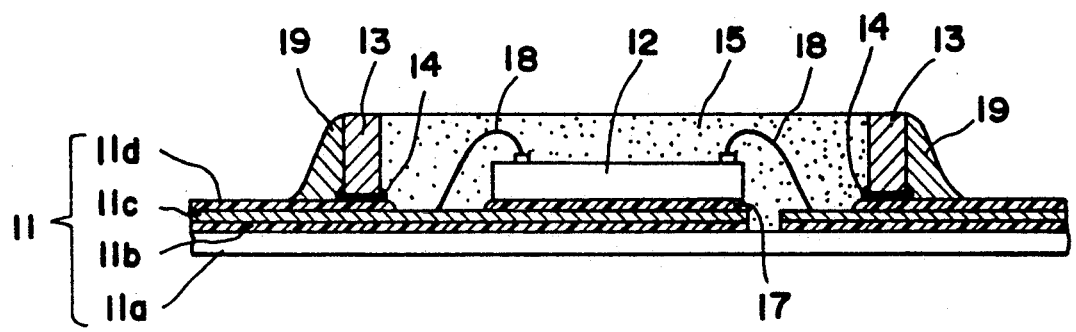
FIG. 10 represents a cross sectional view of another embodiment of the present invention.
Figure 11:
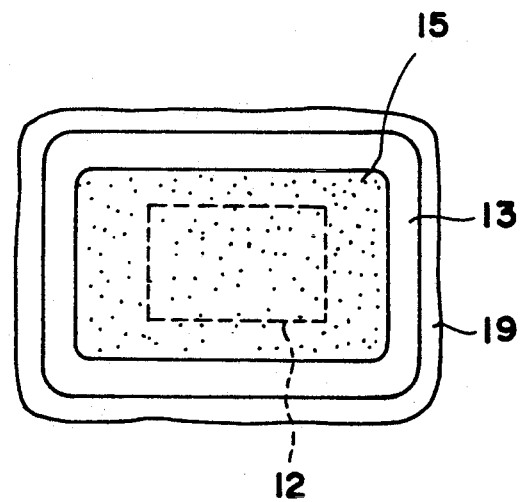
FIG. 11 represents a plane view of the embodiment in FIG. 10.

FIGS. 10 and 11 show another embodiment of the present invention developed in accordance with the above background.

As shown in FIG. 10 and FIG. 11, an IC chip 12 is mounted on a flexible circuit board 11. This flexible circuit board 11 consists of a polyimide base film 11a upon which a copper foil circuit pattern 11c is adhered with an epoxy adhesive 11b and a polyimide cover layer 11d which is in turn adhered to the circuit pattern 11c with an adhesive (not shown). The chip 12 is adhered with a die-bond resin 17 to the circuit pattern 11c where the cover layer 11d has been removed, and the chip 12 and the circuit pattern 11c are connected with bonding wires 18.

A frame 13 which encircles the entire outer periphery of the chip 12 is adhered to the cover layer 11d with a water repellent adhesive 14. Outside this water repellent adhesive 14 (silicon, epoxy or polyimide), the periphery around the outside of the frame 13 and the cover layer 11d are puttied with an adhesive 19 (epoxy or polyimide) to strengthen the adhesive force of the frame 13 to the cover layer 11d. The inside of the frame 13 is then filled with an epoxy or silicon resin sealant 15. Also, as shown in FIG. 11, all corners of the above-mentioned frame 13 are rounded to prevent the concentration of stress.

Figure 12:
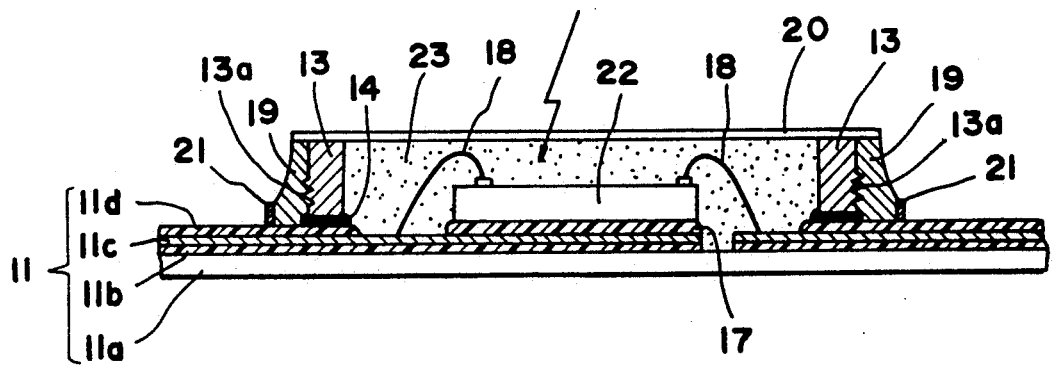
FIG. 12 represents a cross sectional view of still another embodiment of the present invention.

FIG. 12 shows still another embodiment of the present invention, in which a photosensitive element 22 is mounted on the flexible printed circuit. As shown in FIG. 12, this embodiment includes a cover 20 made of transparent resin, glass or glass filter located on the top of the transparent resin sealant 23. An incident ray (an arrow in FIG. 12) is received by the photosensitive element 22 through the cover 20 and the resin sealant 23. A projection 21 is provided around the outer periphery of the frame 13 to prevent the flow of adhesive 19. Further, a corrugated or grooved section 13a is provided on the outer periphery of the frame 13 to provide a better grip for the adhesive 19.

The structure of FIG. 10 or 12 is also applicable to a hard printed circuit board with hard substances such as glass epoxy instead of a flexible circuit board 11.

The adhesive used outside the frame and the resin sealant used inside the frame are prevented from coming into contact with each other by water repellent adhesive. The external adhesive should not be of a special type such as of water repellent. The only limit in selecting the external adhesive is to avoid such an adhesive which could permeate permeating into the water repellent adhesive to deteriorate the waterproof between the frame and the circuit board. Thus, a suitable adhesive with a sufficient adhesive force can be freely selected. It is not necessary that the resin sealant be capable of adhering the frame to the circuit board.

As shown above, by using a process in which the water repellent adhesive is effectively utilized, it is now possible to strongly adhere the frame to the circuit board, and there is less a possibility of the frame separating from the circuit board, either through the action of an external force or when a flexible circuit board is used. In addition, there are no restrictions on the resin sealant which can be used and the reliability of the sealing of a chip component is improved.

The mounting of IC chips directly on flexible printed circuit boards has the following advantages. Firstly, circuit configuration can be made dimensionally smaller as compared to mounting of a packaged IC. Secondly, the packaged IC requires connections between the IC and the package leads and also between the package leads and the pattern of the printed circuit board. However, if an IC is mounted directly to the pattern of the printed circuit board, the number of connections will be reduced since it will not be necessary to make any connections equal to those between the package leads and the pattern of the printed circuit board. This improves circuit reliability. The technique of directly mounting the IC chips on the printed circuit board is the same as in that of mounting the IC on the package in which the IC and package leads are electrically connected using the wire bonding method.

Figure 13:
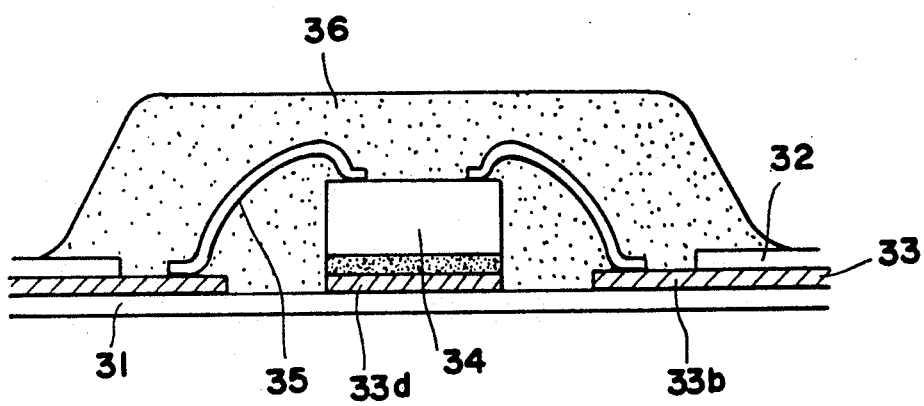
FIG. 13 represents a cross sectional view of a further related art.

FIG. 13 shows an example of a general structure in which an IC chip is mounted directly on a flexible printed circuit board. Numeral 31 is the base film of the flexible printed circuit board, numeral 32 is the covering film which covers the conductive foil 33 forming the printed circuit. An IC chip 34 which is affixed to a die pattern 33d of the conductive foil 33. A bonding wire 35 connects the IC chip 34 with bonding patterns 33b in the form of terminals of the conductive foil 33. Both ends of the bonding wire 35 are respectively connected to the bonding pad of the IC chip 34 and the bonding pattern 33b of the conductive foil 33 by thermal ultrasonic bonding treatment or the like. Cover film 32 is removed at the die pattern 33d and bonding patterns 33b so that IC chips may be affixed and the wire 35 may be connected, respectively. Resin sealant 36 is provided to cover the IC chip 34 and the exposed portions of the conductive foil 33 for the purpose of moisture-proof and also for preventing leakage currents.

The problem with the above construction is the area occupied by the resin sealant 36. As previously explained, the purpose of mounting IC chips directly on flexible printed circuit boards is to reduce the area occupied by the structure of mounting an IC chip and thus make the entire circuit pattern compact to facilitate assembling the flexible printed circuit boards into various devices such as cameras. If the area occupied by the resin sealant is wide, it will not only reduce the mounting density of the IC chips on the printed circuit board but will also kill the flexibility of the board at that part and will consequently reduce the flexibility of the board.

The area occupied by the resin sealant, however, must be greater than the area in which the cover film is removed for mounting the IC chips on the flexible printed circuit board. On the other hand, a wide cover film removal area is desirable from the viewpoint of workability when carrying out wire bonding. This is because variances in position and dimension of cover film removal area, variances in the relative position of the bonding pattern and IC chips, and errors in operation of the bonding machine can be easily absorbed if this area is wide, that is, if the exposed area of the printed circuit bonding pattern is wide. There has not been any standard of harmonizing the inconsistent demands that the resin sealant area be reduced and the cover film removed area be increased.

Figure 14:
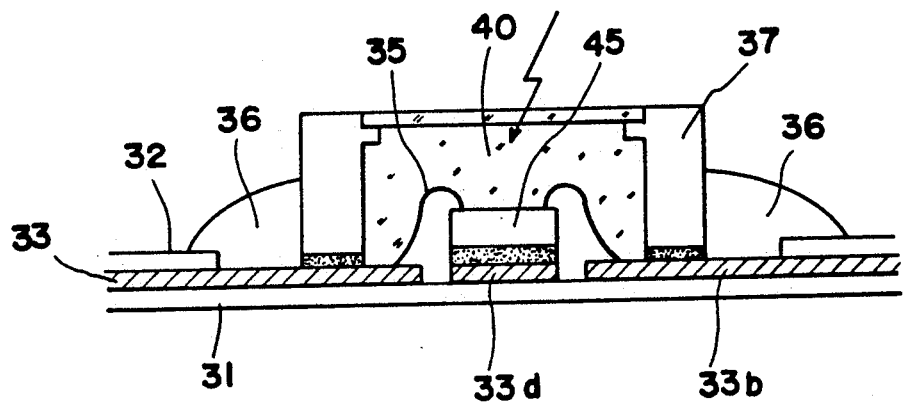
FIG. 14 represents a cross sectional view of a still further related art.

Another example of general structure for mounting an IC chip on a flexible printed circuit board is shown in FIG. 14, in which the IC chip includes light receiving elements. Similar to the example in FIG. 13, IC chip 45 is bonded on the die pattern 33d and connected to the bonding pattern 33b of the printed circuit board by wire 35. Frame 37 is bonded around the IC chip 45, and the IC chip 45 is sealed by injecting transparent resin 40 in the frame 37. An incident ray (an arrow in FIG. 14) is received by the IC chip 45 through the transparent resin 40. In this case, frame 37 is bonded to the conductive foil 33 of the flexible printed circuit board where the cover film 32 is removed. Since the area where the cover film has been removed extends outside frame 37, the conductive foil 33 will be exposed around the outside of frame 37. Resin sealant 36 must therefore be applied around the outside of frame 37 as a moisture-proof measure. Although application of resin sealant 36 around the outside of frame 37 will not be necessary if the size of the cover film removal area is made smaller than the inside dimensions of frame 37, it will mean that frame 37 will be bonded on the cover film 32. However, since the cover film removal area has been made considerably large from the standpoint of workability of wire bonding as previously mentioned, it will mean that frame 37 must be of a sufficiently great size to be positioned outside this area, which makes the IC sealing structure must larger.

Still another feature of the present invention provides an improved structure of mounting an IC chip directly on the board, wherein the area occupied by the resin sealant or the sealing structure on the flexible printed circuit board is made as small as possible.

According to the present invention, the width of the cover film removal to expose the bonding pattern of the printed circuit board is set at less than 2 mm and the length of each terminal of the bonding pattern exposed is set greater than 0.4 mm. When adopting a frame around the IC chip and injecting resin therein for sealing, the present invention recommends that the frame is mounted on the cover film.

As a result in analyzing the processes involved in mounting an IC chip by wire bonding on flexible printed circuit boards, the inventors have found that a length greater than 0.4 mm is required for each terminal if a wire is to be bonded thereon. Further, the inventors have found that the width greater than 2 mm is no more required for the removal of the cover film to secure the necessary length greater than 0.4 mm of each of the exposed terminals.

The reason for the need of greater than 0.4 mm of each terminal of the bonding pattern is to absorb variations in the amount of movement of the wire bonding machine and to assure connection between the wire and the bonding pattern since the wire will be flattened and spread out on the terminal when bonding in order to obtain adequate strength of connection therebetween. Enough length of the terminal of the bonding pattern will therefore be required to match this flattered part of the wire.

Next, the reason why the width of cover film removal greater than 2 mm is not necessary will be explained. In addition to the theoretic value of 0.4 mm of the terminal length required to realize reliability of the aforementioned wire bonding, a length of 0.1 mm is further necessitated since there will be practically a reduction by about 0.1 mm from the nominal dimension due to etching blur at the edge of the terminal. Further, about 0.3 mm will be required to allow the error caused by a deviation of the cover film from the correct position when the cover film is affixed to the printed circuit board with a window cut out where the IC chip is to be mounted. Furthermore, the bonding agent will protrude about 0.3 mm inside the above window. Thus, the following length in total will practically secure an effective length of 0.4 mm:

$$0.4 + 0.1 + 0.3 + 0.3 = 1.1 \text{ mm}$$

In other words, a nominal length greater than 1.1 mm for the exposed portion of each terminal of the bonding pattern is adequate to assure reliability of wire bonding. The present inventors have therefore decided that a width of cover film removal greater than 2 mm is no more necessary from a practical view point to secure the necessary length of each terminal to be exposed for wire bonding, with any other possible facts of tolerance taken into consideration.

For example, if the exposed part of the terminal will be 0.6 mm shorter because of the 0.3 mm deviation of affixing the cover film and the 0.3 mm protrusion of the bonding agent, and if the terminal further becomes 0.1 mm shorter because of etching blur, the remaining length of 1.3 mm for the exposed portion of the terminal will be more than adequate to assure reliability of wire bonding.

When bonding the frame onto the cover film, the inside dimensions of the frame may therefore be made slightly larger than the area in which the cover film is removed.

Figure 15:
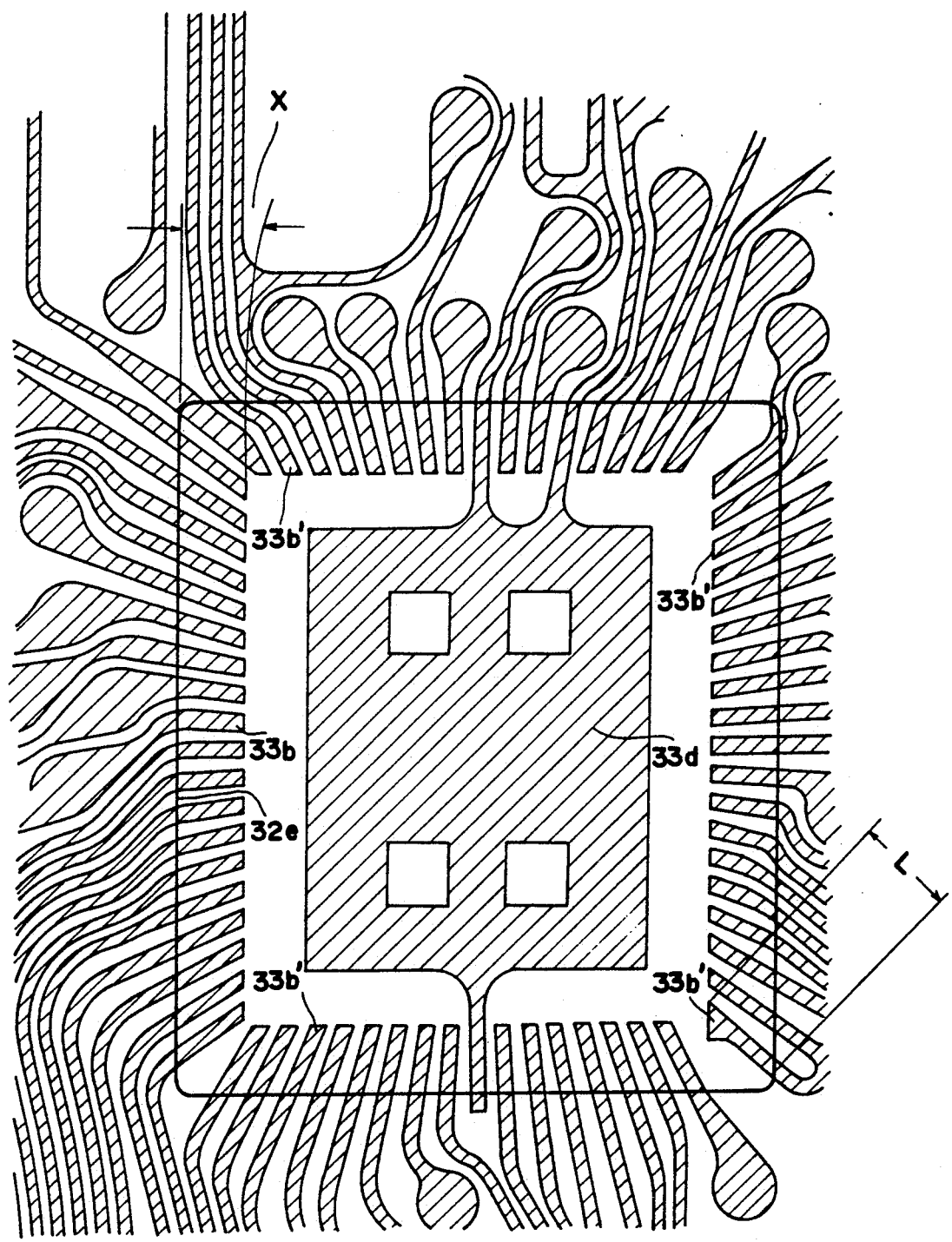
FIG. 15 represents a plane view of a further embodiment of the present invention.

FIG. 15 shows an embodiment showing the above feature of the present invention in which an IC chip is mounted on a flexible printed circuit board. A hatched portion 33d is a die pattern on which IC chip is bonded. A plurality of terminals of bonding patterns 33b and 33b' are provided around the die pattern 33d with the inside of square window 32e being the part in which the cover film is removed. A nominal dimension X, which represents the width of cover film removal area of the bonding patterns 33b and 33b', is 1.1 mm in this embodiment. All terminals of the bonding pattern 33b or 33b' extend linearly toward bonding pads of IC chip. The nominal length L of these terminals of bonding patterns are 1.1 mm at its minimum and 1.5 mm at its maximum. The length L is at its minimum when the terminal is perpendicular to the edge of the window 32e as shown at 33b. Inclining terminals 33b' are longer than the minimum.

In practical process of forming the flexible printed circuit, the location of the cover film would deviate from its correct position on the printed circuit board as has been pointed out. Provided that X=2 mm on opposite both edges of the window in FIG. 15 if the cover film is correctly positioned, X would be charged into 2.3 mm at the right edge and 1.7 mm at the left edge if the cover film is deviated toward the right from the correct position. On both edges, however, sufficient length L greater than 0.4 mm are secured, respectively. From the consideration above the following modification is true for the condition X if the cover film is removed to form a window:

2X<4 mm wherein 2X represents the sum of the width X on the both opposite edges of the window.

Figure 16:
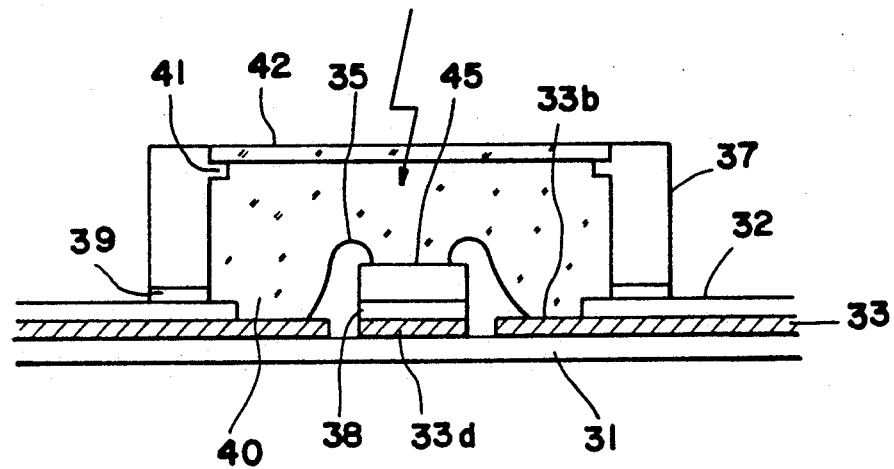
FIG. 16 represents a cross sectional view of a still further embodiment of the present invention.
Figure 17:
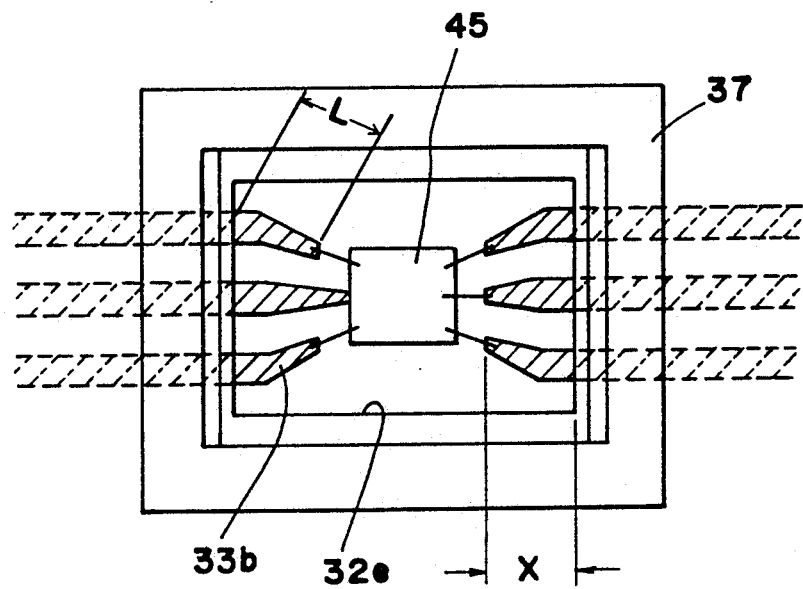
FIG. 17 represents a plane view of the embodiment in FIG. 16.

FIG. 16 and 17 show another embodiment according to this feature of the present invention in which IC chip with a light receiving element is mounted on a flexible printed circuit board. In FIG. 16, numeral 31 represents a base film of the flexible printed circuit board, numeral 32 a cover film with a window of square section indicated by 32e in FIG. 17 removed, and numeral 33 a conductive foil. IC chip 45 is bonded to a die pattern 33d of the conductive foil 33 with bonding agent 38 and is connected to terminals of bonding pattern 33b by wire 35. A frame 37 is positioned on the outer edge of the window of the cover film and is bonded to cover film 32 with bonding agent 39, transparent resin sealant 40 is injected inside the frame 37, and flat transparent resin plate 42 is fitted on an inward facing step 41 and is bonded to transparent resin sealant 40. An incident ray (an arrow in FIG. 16) is received by the IC chip 45 through the plate 42 and the resin sealant 40. In this example, length X of bonding pattern 33b extending into the section in which the cover film has been removed is 1.1 to 1.5 mm.

As is apparent from the above, a feature of the present invention permits making the area occupied by the resin sealant to be as small as possible without affecting the reliability of the circuit. Also, since the length of exposed portion of the bonding pattern is not unnecessarily long, the frame can be bonded to the cover film even in structures where resin sealant is injected in the frame provided and the bother of applying resin sealant on the outside for the purpose of moisture-proofing can be eliminated.

Although the present invention has fully been described in connection with the preferred embodiment thereof with reference to the accompanying drawings, it is to be noted that various changes and modifications are apparent to those skilled in the art. Such changes and modifications are to be understood as being included within the scope for the present invention as defined by the appended claims.

What is claimed is:

1. A flexible printed circuit board comprising:
   a flexible substrate with a printed circuit pattern;
   a die of an integrated circuit chip, mounted on said flexible substrate, including a plurality of connecting terminals;
   a plurality of wires for bonding said connecting terminals of the integrated circuit chip to respective portions of said printed circuit pattern;
   a frame for encircling said integrated circuit chip;
   a water repellent adhesive for gluing said frame to said flexible substrate;
   a second type of adhesive sticking to the outside wall of said frame and said flexible substrate for strengthening the adhesion of said frame to said flexible substrate, and
   a resin sealant to be filled inside said frame for covering said integrated circuit chip.

2. A printed circuit board comprising:
   a substrate with a printed circuit pattern;
   a die of an integrated circuit chip, mounted on said substrate, including a plurality of connecting terminals;
   a cover film provided to cover said circuit pattern for isolating said circuit pattern from unnecessary electrical contact with the outside;
   a plurality of wires for bonding said connecting terminals of the integrated circuit chip to a portion of said printed circuit pattern;
   a frame for encircling said integrated circuit chip, said frame directly glued on said cover film, inside said frame said cover film being partially removed for allowing a portion of said circuit pattern to be wire-bonded with said connecting terminals of the integrated circuit chip;
   a water repellent adhesive for gluing said frame to said substrate;
   a second type of adhesive having strong adhesion and sticking to the outside wall of said frame and said substrate for strengthening the adhesion of said frame to said substrate, and
   resin sealant filling the inside of said frame for covering said integrated circuit chip.

3. The invention of claim 2, wherein said substrate is flexible.

4. An improved flexible printed circuit board comprising:
   a flexible substrate with a printed circuit pattern;
   an integrated circuit chip having terminals connected to the printed circuit pattern;
   a frame member extending about a perimeter of the integrated circuit chip having an inner and outer surface and a bottom surface portion;
   a first adhesive extending between the bottom surface portion of the frame member and the flexible substrate to secure them together;
   a second adhesive extending between the outer surface of the frame member and the flexible substrate to strengthen the adhesion of the frame and flexible substrate beyond that of the first adhesive alone, and
   a resin sealant extending between the inner surface of the frame and covering the integrated circuit chip.

5. The flexible printed circuit board of claim 4 wherein the first adhesive is water repellent.

6. A flexible printed circuit board comprising:
   a flexible substrate with a printed circuit pattern comprised of an array of first terminals;
   a die of an integrated circuit chip mounted on said substrate, including a plurality of second connecting terminals;
   a cover film on said circuit pattern for isolating said circuit pattern from unnecessary electrical contact with the outside, said cover film being removed from the underlying substrate around said integrated circuit chip so as to establish a template by which the cover film aligns with the circuit pattern below and thereby allows electrical interaction by partially exposing the circuit pattern below including the first terminals along the array thereof, a geometry of the first terminals resulting in at least some of the exposed first terminals extending inward from an edge of a remaining portion of said cover film;

a plurality of wires for bonding said second connecting terminals of the integrated circuit chip to the first terminals of the printed circuit pattern, respectively; and a resin sealant for covering said second terminals of said integrated circuit chip, said wires, said first terminals, and a part of said cover film around said integrated circuit chip, wherein the geometry of the first terminals and the manner of removal of said cover film at said terminals addresses the opposing constraints of reducing substrate area while simultaneously providing adequate bonding length by maintaining a sufficient match of the template with the circuit pattern to ensure proper bonding of contacts and still permit errors in the manufacturing process by fulfilling the following conditions:

$$X < 2 \text{ mm}$$

$$L > 0.4 \text{ mm}$$

wherein:

X represents the width of the array of the terminals of said circuit pattern with said cover film removed, and L represents the length of each of said terminals of the circuit pattern not covered by said cover film.

7. The invention of claim 6, wherein the following condition is fulfilled:

$$1.1 \text{ mm} < X < 2.0 \text{ mm}.$$

8. The invention of claim 6, wherein said cover film is removed to form a window of exposing said circuit pattern at which said die of an integrated circuit is mounted, and wherein said array of terminals of the printed circuit pattern are arranged to encircle said integrated circuit along the inside edge of said window of the cover film.

9. A flexible printed circuit board comprising;

a flexible substrate with a printed circuit pattern comprised of an array of first terminals;

a die of an integrated circuit chip mounted on said substrate, including a plurality of second connecting terminals;

a cover film on said circuit pattern for isolating said circuit pattern form unnecessary electrical contact with the outside, said cover film being removed from the underlying substrate around said integrated circuit ship so as to establish a template by which the cover film aligns with the circuit pattern below and thereby allows electrical interaction by partially exposing the circuit pattern below including the first terminals along the array thereof, a geometry of the first terminals resulting in at least some of the exposed first terminals extending inward from an edge of a remaining portion of said cover film;

a plurality of wires for bonding said second connecting terminals of the integrated chip to the first terminals of the printed circuit pattern, respectively; and a resin sealant for covering said second terminals of said integrated circuit chip, said wires, said first terminals, and a part of said cover film around said integrated circuit chip, wherein said cover film is removed to form a window for exposing said circuit pattern at which said die of the integrated circuit is mounted, and wherein said array of terminals of the printed circuit pattern are arranged to encircle said integrated circuit along the inside edge of said window of the cover film, the geometry of the first terminals and the manner of removal of said cover film at said terminals addresses the opposing constraints of reducing substrate area while simultaneously providing adequate bonding length by maintaining a sufficient match of the template with the circuit pattern to ensure proper bonding of contracts and still permit errors in the manufacturing process by fulfilling the following conditions:

$$2X < 4 \text{ mm}$$

$$L > 0.4 \text{ mm}$$

wherein:

2X represents the sum of the width of two arrays of the terminals of said circuit pattern with said cover film removed along the opposite edges of said window, and L represents the length of each of sad terminals of the circuit pattern not covered by said cover film.

10. A flexible printed circuit board comprising;

a flexible substrate with a printed circuit pattern comprised of an array of first terminals;

a die of a chip element mounted on said substrate, including a plurality of second connecting terminals;

a cover film on said circuit pattern for isolating said circuit patter from unnecessary electrical contact with the outside, said cover film being removed from the underlying substrate around said die so as to establish a template by which the cover film aligns with the circuit pattern below and thereby allows electrical interaction by partially exposing the circuit pattern below including the first terminals along the array thereof, said particular pattern being such that said first terminals extend inwardly away from an edge said cover film and convergingly towards said second connecting terminals;

a plurality of wires for bonding said second connecting terminals of said die to the first terminals of the printed circuit pattern, respectively; and a resin sealant for covering said second terminals of said die, said wires, said first terminals, and a part of said cover film around said die, wherein the geometry of the first terminals and the manner of removal of said cover film at said terminals addresses the opposing constraints of reducing substrate area while simultaneously providing adequate bonding length by maintaining a sufficient match of the template with the circuit pattern to ensure proper bonding of contacts and still permit errors in the manufacturing process by fulfilling the following conditions;

$$X < 2 \text{ mm}$$

$$L > 0.4 \text{ mm}$$

wherein:

X represents the width of the array of the terminals of said circuit pattern with said cover film removed, and p1 L represents the length of each of sad terminals of the circuit pattern not covered by said cover film.

11. The invention of claim 10, wherein the following condition is fulfilled:

1.1 mm < X < 2.0 mm.

12. A flexible printed circuit board comprising:
a flexible substrate with a printed circuit pattern comprised of an array of first terminals;
a die of a chip mounted on said substrate, including a plurality of second connecting terminals;
a cover film on said circuit pattern for isolating said circuit pattern from unnecessary electrical contact with the outside, said cover film being removed from the underlying substrate around said die to establish a template by which the cover film aligns with the circuit pattern below and thereby allows electrical interaction by partially exposing the circuit pattern below to form a window for exposing the first terminals along the array thereof, said particular pattern being such that said first terminals extend inwardly away from an edge of said cover film and convergingly towards said second connecting terminals; and
a plurality of wires for bonding said second connecting terminals of said die to the first terminals of said printed circuit pattern, respectively, wherein the geometry of the first terminals and the manner of removal of said cover film at said terminals addresses the opposing constraints of reducing substrate area while simultaneously providing adequate bonding length by maintaining a sufficient match of the template with the circuit pattern to ensure proper bonding of contacts and still permit errors in the manufacturing process by fulfilling the following conditions:

2X < 4 mm

L > 0.4 mm wherein:
2X represents the sum of the width of two arrays of the terminals of said circuit pattern with said cover film removed along the opposite edges of said window, and
L represents the length of each of said terminals of the circuit pattern not covered by said cover film.

13. A flexible printed circuit board for wire bonding a die of an integrated circuit thereto, comprising:
a die of an integrated circuit chip having a plurality of first connecting terminals;
a flexible substrate directly supporting the integrated circuit chip, the flexible substrate comprising a flexible substantially planar base layer and having a printed circuit pattern thereon, the circuit pattern including an array of second connecting terminals;
a cover film on the flexible substrate for insulating the circuit pattern form external contact, the cover film being removed above an integral portion of the base layer around said integrated circuit chip to establish a template by which the cover film aligns with the circuit pattern below and thereby allows electrical interaction by partially exposing the circuit pattern below including a portion of each second connecting terminals of the array of second connecting terminals along an edge of the cover film and around the integrated circuit chip, wherein the geometry of the second connecting terminals and the manner of removal of the cover film addresses the opposing constraints of reducing substrate area while simultaneously providing adequate bonding length by maintaining a sufficient match of the template with the circuit pattern to ensure proper bonding of contacts and still permit errors in the manufacturing process by satisfying the following dimensional conditions:

X < 2 mm

L > 0.4 mm wherein:
X represents the width of the array of the second connecting terminals as measured from the edge of the cover film; and
L represents the length of the exposed portion of each second connecting terminal as measured from the edge of the cover film;
a plurality of wires bonding the first connecting terminals of the integrated circuit chip to the array of second connecting terminals; and a resin sealant for covering the integrated circuit chip, the first connecting terminals, the array of second connecting terminals, the wires, and a part of the cover film around said integrated circuit chip.

14. A flexible printed circuit board, comprising:
a flexible substrate with a printed circuit pattern comprised of an array of first terminals;
a die of an integrated circuit chip mounted on said substrate, including a plurality of second connecting terminals;
a cover film on said circuit pattern for isolating said circuit pattern form unnecessary electrical contact with the outside, said cover film being removed around said integrated circuit chip so as to expose the first terminals along the array thereof, a geometry of the first terminals resulting in at least some of the exposed first terminals extending inward at an obtuse angle from an edge of a remaining portion of said cover film;
a plurality of wires for bonding said second connecting terminals of the integrated circuit chip to the first terminals of the printed circuit pattern, respectively; and
a resin sealant for covering said second terminals of said integrated circuit chip, said wires, said first terminals, an a part of said cover film around said integrated circuit chip, wherein the geometry of the first terminals and the manner of removal of said cover film at said terminals addresses the opposing constraints of reducing substrate area while simultaneously providing adequate bonding length by fulfilling the following conditions:

X < 2 m

L > 0.4 mm wherein:

X represents the width of the array of the terminals of said circuit pattern with said cover film removed, and L represents the length of each of said terminals of the circuit pattern not covered by said cover film.

15. A flexible printed circuit board, comprising:

a flexible substrate with a printed circuit pattern comprised of an array of first terminals;

a die of an integrated circuit chip mounted on said substrate, including a plurality of second connecting terminals;

a cover film on said circuit pattern for isolating said circuit pattern form unnecessary electrical contact with the outside, said cover film being removed around said integrated circuit chip so as to expose the first terminals along the array thereof, a geometry of the first terminals resulting in at least some of the exposed first terminals extending inward at an obtuse angle from an edge of a remaining portion of said cover film;

a plurality of wires for bonding said second connecting terminals of the integrated circuit chip to the first terminals of the printed circuit pattern, respectively; and a resin sealant for covering said second terminals of said integrated circuit chip, said wires, said first terminals, and a part of said cover film around said integrated circuit chip, wherein said cover film is removed to form a window for exposing said circuit pattern at which said die of the integrated circuit is mounted, and wherein said array of terminals of the printed circuit pattern are arranged t encircle said integrated circuit along the inside edge of said window of the cover film, the geometry of the first terminals and the manner of removal of said cover film at said terminals addresses the opposing constraints of reducing substrate area while simultaneously providing adequate bonding length by fulfilling the following conditions:

$$2X < 4 \text{ mm}$$

$$L > 0.4 \text{ mm}$$

2X represents the sum of the width of two arrays of the terminals of said circuit pattern with said cover film removed along the opposite edges of said window, and L represents the length of each of said terminals of the circuit pattern not covered by said cover film.

* * * * *